(12) United States Patent
Takao

(10) Patent No.: US 11,437,360 B2
(45) Date of Patent: Sep. 6, 2022

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventor: Toma Takao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 79 days.

(21) Appl. No.: 16/990,205

(22) Filed: Aug. 11, 2020

(65) Prior Publication Data

US 2021/0125976 A1 Apr. 29, 2021

(30) Foreign Application Priority Data

Oct. 24, 2019 (JP) .............................. JP2019-193236

(51) Int. Cl.
*H01L 25/18* (2006.01)
*H01L 21/56* (2006.01)
*H01L 23/42* (2006.01)
*H01L 23/367* (2006.01)
*H01L 23/31* (2006.01)

(52) U.S. Cl.
CPC .............. *H01L 25/18* (2013.01); *H01L 21/56* (2013.01); *H01L 23/3157* (2013.01); *H01L 23/367* (2013.01); *H01L 23/42* (2013.01)

(58) Field of Classification Search
None
See application file for complete search history.

(56) References Cited

U.S. PATENT DOCUMENTS

| 2006/0281220 | A1* | 12/2006 | Kuramochi | H01L 23/49894 438/106 |
| 2013/0249100 | A1* | 9/2013 | Morishita | H01L 23/3677 257/772 |
| 2014/0027891 | A1* | 1/2014 | Kimura | H01L 21/561 257/675 |
| 2015/0144991 | A1* | 5/2015 | Ha | H01L 23/373 257/139 |
| 2019/0318987 | A1* | 10/2019 | Lin | H01L 21/563 |

FOREIGN PATENT DOCUMENTS

| JP | 2009-111153 A | 5/2009 |
| JP | 2017-099035 A | 6/2017 |

* cited by examiner

*Primary Examiner* — Michelle Mandala
*Assistant Examiner* — Jordan M Klein
(74) *Attorney, Agent, or Firm* — Studebaker & Brackett PC

(57) ABSTRACT

A semiconductor device includes a semiconductor module, a substrate, and a filler. The semiconductor module includes a semiconductor chip, a control integrated circuit (IC) configured to control driving of the semiconductor chip, and a package sealing the semiconductor chip and the control IC with an insulation material. On the substrate, the semiconductor module is mounted. The filler is provided between a lower surface of the package of the semiconductor module and the substrate. The substrate includes a through hole being provided at a position below the package and closer to the control IC than to the semiconductor chip in the package.

10 Claims, 5 Drawing Sheets

SEMICONDUCTOR DEVICE AND METHOD OF MANUFACTURING SEMICONDUCTOR DEVICE

BACKGROUND OF THE INVENTION

Field of the Invention

The present invention relates to a semiconductor device and a method of manufacturing the semiconductor device.

Description of the Background Art

In general, surface-mount power semiconductor modules are used without a heat sink. In this case, heat generated in a semiconductor chip inside a package is dissipated from its surface into air through resin constituting the package, or is dissipated from the inside of the package to a substrate through an externally connected terminal. Heat dissipation efficiency of a path in which heat is dissipated from a surface of a package into air depends on the size of the package of the power semiconductor module, and thus it is difficult to improve heat dissipation efficiency. In view of this, heat dissipation efficiency of a path in which heat is dissipated from the inside of a package to a substrate through a terminal has hitherto been improved by increasing the area of a circuit pattern of the substrate. However, with a growing demand of downsizing the substrate, increasing the area of a circuit pattern has become impracticable, raising fears that enhancement of performance of a semiconductor module may be limited due to the limitation of the heat dissipation area.

To improve heat dissipation performance of a semiconductor element, Japanese Patent Application Laid-Open No. 2017-99035 discloses a technology of injecting a filler for heat dissipation between a semiconductor element and a metal substrate through an injection hole provided in the metal substrate.

When a filler is provided between a package of a semiconductor module and a circuit substrate on which the semiconductor module is mounted, the package and the substrate come into close contact with each other through the filler. Accordingly, heat generated in a semiconductor chip inside the package is transferred from a lower portion of the package to a substrate. However, if such an injection hole provided in a substrate to inject a filler is located at a position below a semiconductor chip that generates a large amount of heat, heat generated in the semiconductor chip is transferred from a lower portion of a package to the injection hole. Specifically, the injection hole impairs an effect of heat dissipation from the semiconductor chip to the substrate.

SUMMARY

The present disclosure is made to solve the problems described above, and provides a semiconductor device that secures injectability of a filler and improves heat dissipation performance.

A semiconductor device according to the present disclosure includes a semiconductor module, a substrate, and a filler. The semiconductor module includes a semiconductor chip, a control integrated circuit (IC) configured to control driving of the semiconductor chip, and a package sealing the semiconductor chip and the control IC with an insulation material. On the substrate, the semiconductor module is mounted. The filler is provided between a lower surface of the package of the semiconductor module and the substrate. The substrate includes a through hole being provided at a position below the package and closer to the control IC than to the semiconductor chip in the package.

According to the present disclosure, the semiconductor device that secures the injectability of the filler and improves the heat dissipation performance is provided.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

First Embodiment

Figure 1:
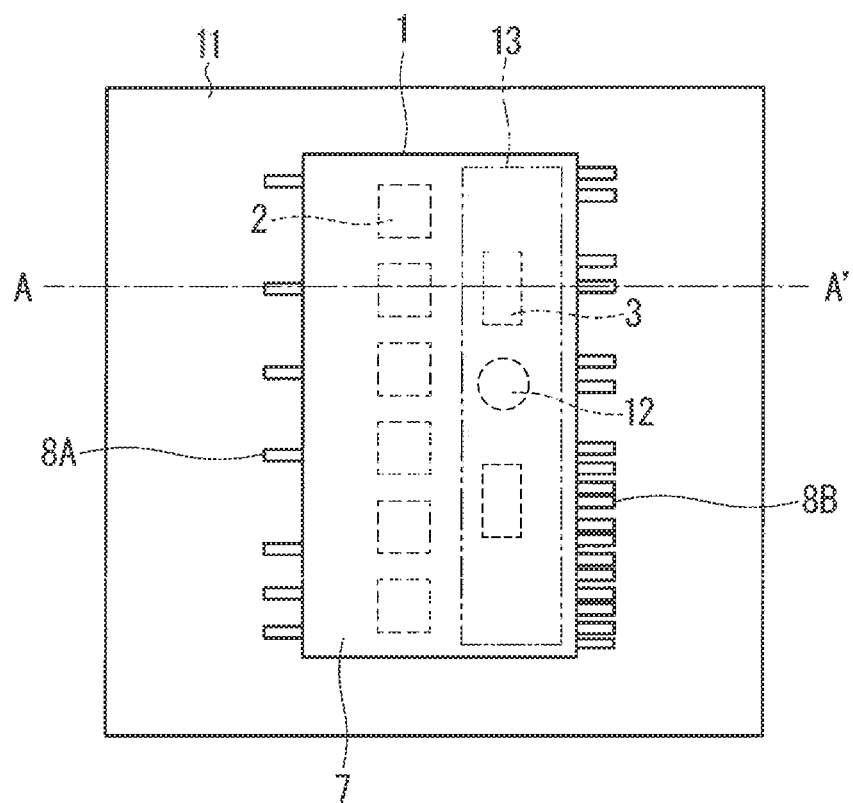
FIG. 1 is a top view illustrating a configuration of a semiconductor device according to the first embodiment.
Figure 2:
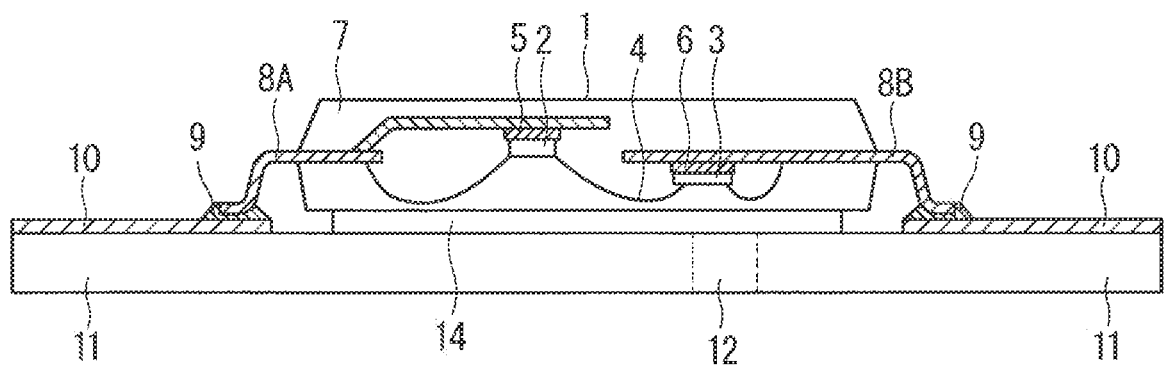
FIG. 2 is a cross-sectional view illustrating a configuration of the semiconductor device according to the first embodiment.

FIG. 1 is a top view illustrating a configuration of a semiconductor device according to the first embodiment. FIG. 2 is a cross-sectional view illustrating a configuration of the semiconductor device according to the first embodiment, and illustrates a cross-section taken along the line A-A' illustrated in FIG. 1.

The semiconductor device includes a semiconductor module 1, a substrate 11, and a filler 14. The semiconductor module 1 includes a semiconductor chip 2, a control integrated circuit (IC) 3, a package 7, and lead parts 8A and 8B.

The semiconductor chip 2 includes a semiconductor element, and is made of, for example, a semiconductor such as Si or a so-called wide bandgap semiconductor such as SiC and GaN. The semiconductor chip 2 includes, for example, an insulated gate bipolar transistor (IGBT), a metal oxide semiconductor field effect transistor (MOSFET), a Schottky barrier diode, or the like. The semiconductor chip 2 is, for example, a power semiconductor chip.

The control IC 3 is an IC for controlling driving of the semiconductor chip 2. The control IC 3 is connected to the semiconductor chip 2 with a wire 4. A heat generation amount of the control IC 3 during driving is smaller than a heat generation amount of the semiconductor chip 2 during driving.

The lead part 8A has one end (the first end) connected to the semiconductor chip 2 with a bonding material 5 inside the package 7, and the other end (the second end) exposed to the outside of the package 7. In a similar manner, the lead part 8B has the first end connected to the control IC 3 with a bonding material 6, and the second end exposed to the outside of the package 7. The second ends of the lead parts 8A and 8B according to the first embodiment project to the outside of the package 7. The second ends of the lead parts 8A and 8B have a function as a connection terminal.

The package 7 internally includes the semiconductor chip 2, the control IC 3, and the first ends of the lead parts 8A and 8B, and seals these components with a mold resin.

The substrate 11 includes a circuit pattern 10 and a through hole 12. The circuit pattern 10 is bonded to the second ends of the lead parts 8A and SB through bonding materials 9. In this manner, the semiconductor module 1 is mounted on the substrate 11. The through hole 12 is provided at a position below the package 7 and closer to the control IC 3 than to the semiconductor chip 2 in the package 7. For example, in the plan view illustrated in FIG. 1, a distance from the edge of the through hole 12 to the control IC 3 is shorter than a distance from the same edge of the through hole 12 to the semiconductor chip 2. Alternatively, for example, a distance from the center of the through hole 12 to the control IC 3 is shorter than a distance from the same center of the through hole 12 to the semiconductor chip 2. For example, as illustrated in FIG. 1, the through hole 12 is provided in a region 13 below the control IC 3.

The filler 14 is provided between the lower surface of the package 7 of the semiconductor module 1 and the substrate 11. The filler 14 is, for example, heat conductive grease.

Figure 3:
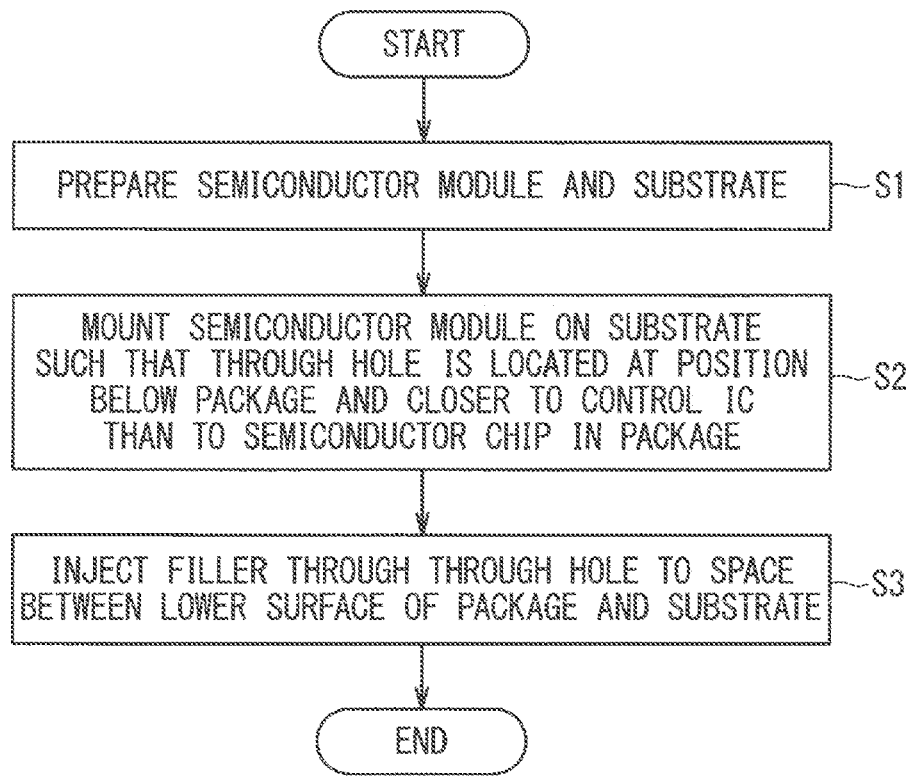
FIG. 3 is a flowchart illustrating a method of manufacturing the semiconductor device according to the first embodiment.

Next, a method of manufacturing the semiconductor device according to the first embodiment will be described. FIG. 3 is a flowchart illustrating a method of manufacturing the semiconductor device according to the first embodiment.

In Step S1, the semiconductor module 1 including the semiconductor chip 2, the control IC 3, and the package 7 and the substrate 11 including the through hole 12 are prepared.

In Step S2, the semiconductor module 1 is mounted on the substrate 11 such that the through hole 12 is located at a position below the package 7 and closer to the control IC 3 than to the semiconductor chip 2 in the package 7.

In Step S3, the filler 14 is injected through the through hole 12 to a space between the lower surface of the package 7 of the semiconductor module 1 and the substrate 11. Specifically, the through hole 12 is an injection hole for the filler 14. Through the manufacturing method described above, the semiconductor device illustrated in FIG. 1 and FIG. 2 is manufactured.

To sum up the above description, the semiconductor device according to the first embodiment includes the semiconductor module 1, the substrate 11, and the filler 14. The semiconductor module 1 includes the semiconductor chip 2, the control IC 3 that controls driving of the semiconductor chip 2, and the package 7 that seals the semiconductor chip 2 and the control IC 3 with an insulation material. The semiconductor module 1 is mounted on the substrate 11. The filler 14 is provided between the lower surface of the package 7 of the semiconductor module 1 and the substrate 11. The substrate 11 includes the through hole 12 that is provided at a position below the package 7 and closer to the control IC 3 than to the semiconductor chip 2 in the package 7.

The package 7 and the substrate 11 come into close contact with each other through the filler 14, and thus heat generated in the semiconductor chip 2 is transferred from a lower portion of the package 7 to the substrate 11. If the through hole 12 is located at a position close to the semiconductor chip 2 that generates a large amount of heat, heat generated in the semiconductor chip 2 is transferred to the through hole 12. Specifically, the through hole 12 impairs an effect of heat dissipation from the semiconductor chip 2 to the substrate 11. However, the through hole 12 according to the first embodiment is provided at a position closer to the control IC 3 that generates a small amount of heat than to the semiconductor chip 2. Thus, heat generated in the semiconductor chip 2 is more efficiently transferred to the substrate 11 than to the through hole 12. Such a heat dissipation path enhances heat dissipation performance of the semiconductor device. Particularly when the semiconductor chip 2 is a power semiconductor chip that controls high power, the semiconductor chip 2 generates a large amount of heat. Thus, the semiconductor device according to the first embodiment exerts greater effects when the semiconductor chip 2 is a power semiconductor chip. Further, the through hole 12 is located at a position below the package 7 of the semiconductor chip 2, and thus the filler 14 can be accurately and efficiently injected.

The first embodiment has described an example of a surface-mount power semi conductor device. However, the semiconductor device is not limited to having such a configuration, and may be a lead-insertion power semiconductor device.

Second Embodiment

A semiconductor device and a method of manufacturing the semiconductor device according to the second embodiment will be described. The second embodiment belongs to a subordinate concept of the first embodiment. Note that description of configurations and operations similar to those of the first embodiment will be omitted.

Figure 4:
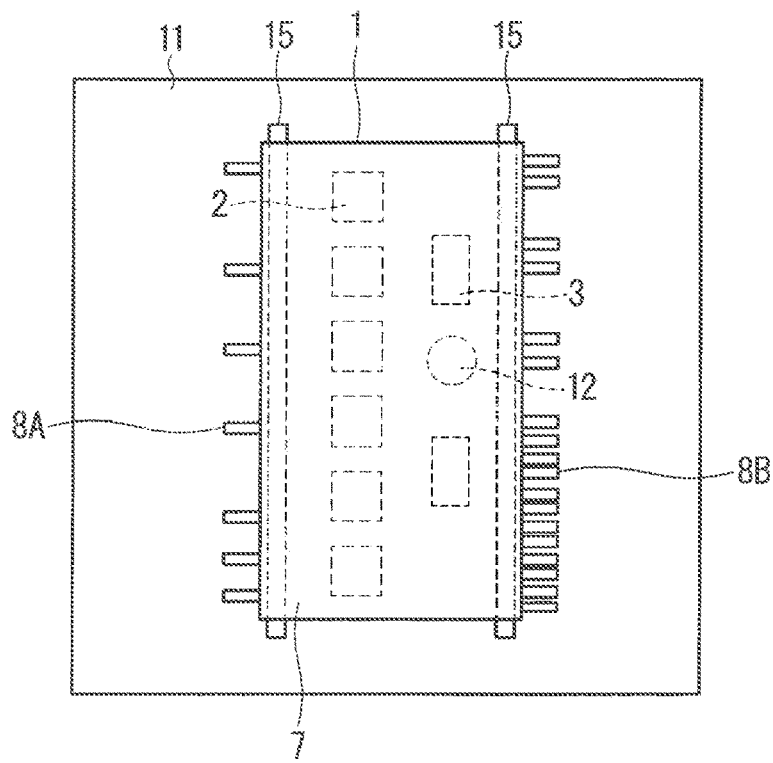
FIG. 4 is a top view illustrating a configuration of a semiconductor device according to the second embodiment.

FIG. 4 is a top view illustrating a configuration of a semiconductor device according to the second embodiment. The semiconductor device according to the second embodiment is the same as the semiconductor device according to the first embodiment, except a configuration of the substrate 11.

The substrate 11 includes slits 15, in addition to the through hole 12. Each of the slits 15 is provided at a position inside the package 7 with respect to a root portion, i.e., a base end portion and below the package 7. The base end portion is a portion at which the lead part 8A or 8B is exposed from the outer surface of the package 7. Further, the slits 15 penetrate the substrate 11. Although two slits 15 are provided in the second embodiment, the number of slits 15 is not limited to two. The width of each slit 15 is, for example, 1 mm.

In the method of manufacturing the semiconductor device according to the second embodiment, the step of preparing the semiconductor module 1 and the substrate 11 and the step of mounting the semiconductor module 1 on the substrate 11 are similar to Steps S1 and S2 illustrated in FIG. 3.

If, in Step S3, an excessive filler 14 is injected through the through hole 12 to a space between the package 7 and the substrate 11, the excessive filler 14 falls to a lower portion of the substrate 11 through the slits 15.

In this manner, the slits 15 can forestall adhesion of the filler 14 to the second ends of the lead parts 8A and 8B.

Particularly when the filler 14 is conductive, the slits 15 can forestall a short circuit between the leads.

Third Embodiment

A semiconductor device and a method of manufacturing the semiconductor device according to the third embodiment will be described. The third embodiment belongs to a subordinate concept of the first embodiment. Note that description of configurations and operations similar to those of the first or second embodiment will be omitted.

Figure 5:
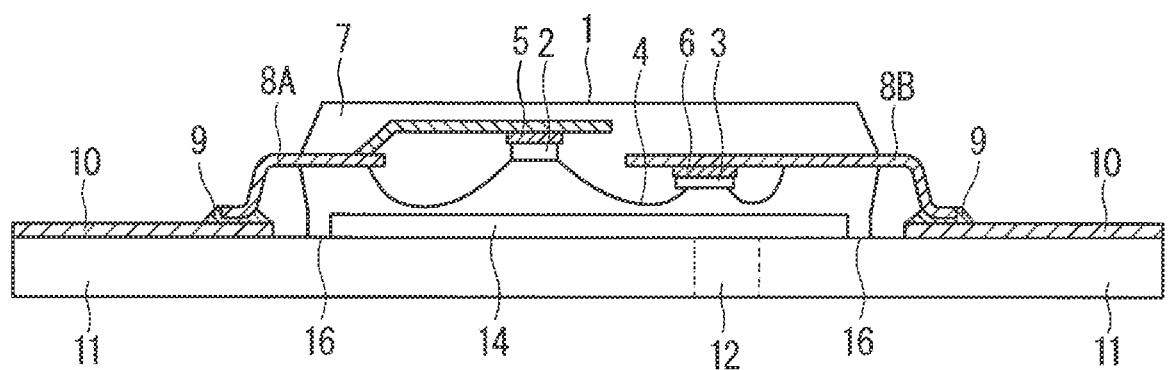
FIG. 5 is a cross-sectional view illustrating an example of a configuration of a semiconductor device according to the third embodiment.
Figure 6:
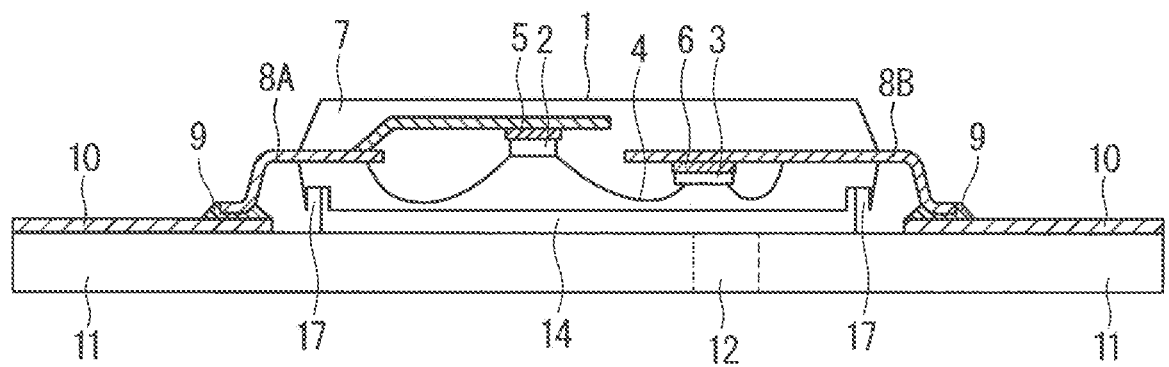
FIG. 6 is a cross-sectional view illustrating another example of a configuration of the semiconductor device according to the third embodiment.

FIG. 5 is a cross-sectional view illustrating an example of a configuration of a semiconductor device according to the third embodiment. FIG. 6 is a cross-sectional view illustrating another example of a configuration of the semiconductor device according to the third embodiment. The semiconductor device according to the third embodiment is the same as the semiconductor device according to the first embodiment, except a configuration of the package 7 of the semiconductor module 1.

As illustrated in FIG. 5, the package 7 includes a projecting portion 16 in its lower portion. Alternatively, as illustrated in FIG. 6, the package 7 includes a recessed portion 17.

In the method of manufacturing the semiconductor device according to the third embodiment, the step of preparing the semiconductor module 1 and the substrate 11 and the step of mounting the semiconductor module 1 on the substrate 11 are similar to Steps S1 and S2 illustrated in FIG. 3.

If, in Step S3, an excessive filler 14 is injected through the through hole 12 to a space between the package 7 and the substrate 11, the projecting portion 16 or the recessed portion 17 catches the excessive filler 14.

In this manner, the projecting portion 16 or the recessed portion 17 of the package 7 forestalls adhesion of the tiller 14 to the second ends of the lead parts 8A and SB. Particularly when the filler 14 is conductive, the projecting portion 16 or the recessed portion 17 forestalls a short circuit between the lead parts 8A and 8B.

Fourth Embodiment

A semiconductor device and a method of manufacturing the semiconductor device according to the fourth embodiment will be described. The fourth embodiment belongs to a subordinate concept of the first embodiment. Note that description of configurations and operations similar to those of any one of the first to third embodiments will be omitted.

Figure 7:
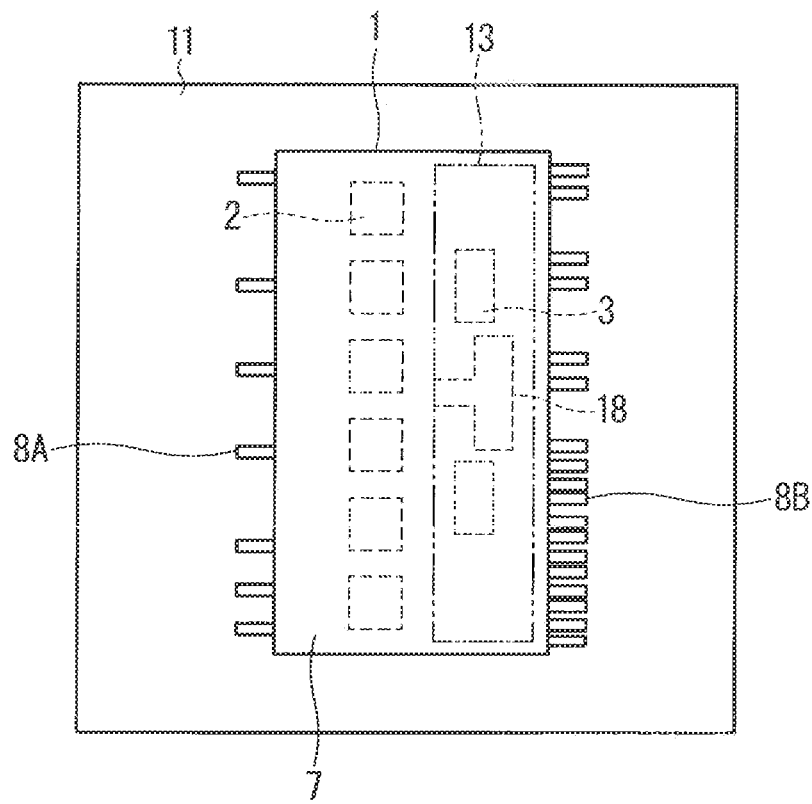
FIG. 7 is a top view illustrating a configuration of a semiconductor device according to the fourth embodiment.

FIG. 7 is a top view illustrating a configuration of a semiconductor device according to the fourth embodiment. The semiconductor device according to the fourth embodiment is the same as the semiconductor device according to the first embodiment, except a configuration of the substrate 11. The substrate 11 includes a through hole 18 having a projecting shape in plan view. In the method of manufacturing the semiconductor device according to the fourth embodiment, the step of preparing the semiconductor module 1 and the substrate 11 and the step of mounting the semiconductor module 1 on the substrate 11 are similar to Steps S1 and S2 illustrated in FIG. 3.

The filler 14 injected through the through hole 18 having a projecting shape smoothly spreads to the entire lower portion of the package 7. The through hole 18 having a projecting shape enhances injectability of the filler 14.

Fifth Embodiment

A semiconductor device and a method of manufacturing the semiconductor device according to the fifth embodiment will be described. The fifth embodiment belongs to a subordinate concept of the first embodiment. Note that description of configurations and operations similar to those of any one of the first to fourth embodiments will be omitted.

Figure 8:
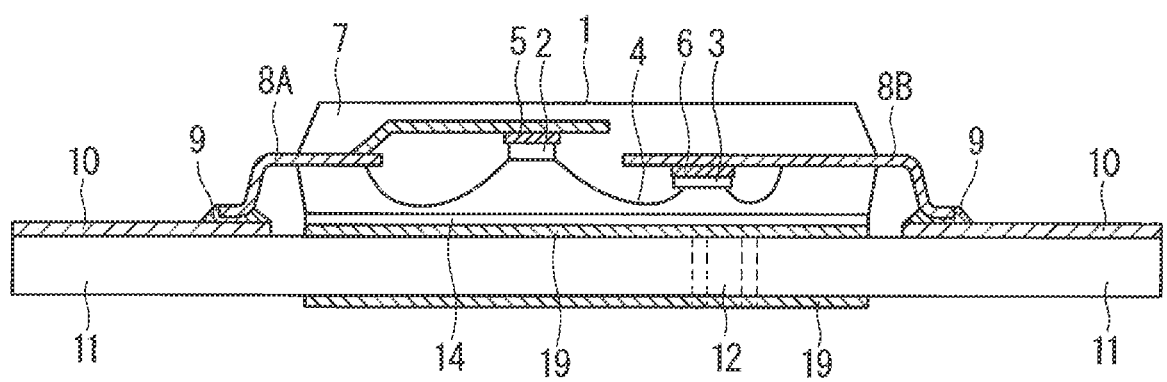
FIG. 8 is a cross-sectional view illustrating a configuration of a semiconductor device according to the fifth embodiment.

FIG. 8 is a cross-sectional view illustrating a configuration of a semiconductor device according to the fifth embodiment. The semiconductor device according to the fifth embodiment is the same as the semiconductor device according to the first embodiment, except a configuration of the substrate 11.

The substrate 11 includes a metal pattern 19 that covers a side surface of the through hole 12 and extends from the edge of the through hole 12 to a front surface and a back surface of the substrate 11. Specifically, the metal pattern 19 and the through hole 12 form a so-called "via" or "through hole". It is preferable that the size of the metal pattern 19 extending in the surface of the substrate 11 be the same size as the package 7.

The metal pattern 19 as described above diffuses heat transferred from the semiconductor chip 2 through the package 7 and the filler 14 to the back surface of the substrate 11, and thereby enhances an effect of heat dissipation.

Sixth Embodiment

A semiconductor device and a method of manufacturing the semiconductor device according to the sixth embodiment will be described. The sixth embodiment belongs to a subordinate concept of the first embodiment. Note that description of configurations and operations similar to those of any one of the first to fifth embodiments will be omitted.

Figure 9:
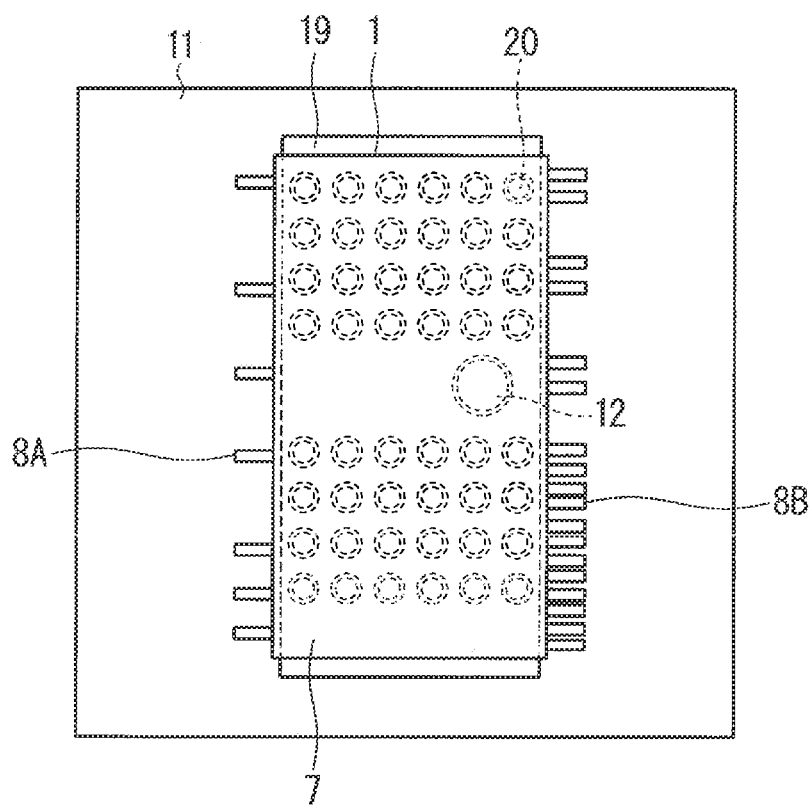
FIG. 9 is a top view illustrating a configuration of a semiconductor device according to the sixth embodiment.

FIG. 9 is a top view illustrating a configuration of a semiconductor device according to the sixth embodiment. The semiconductor device according to the sixth embodiment is the same as the semiconductor device according to the first embodiment, except a configuration of the substrate 11. Note that, although illustration of the semiconductor chip 2 and the control IC 3 is omitted in FIG. 9, locations of those components are the same as those in the first embodiment.

The substrate 11 further includes at least one fine hole 20 at a position below the package 7. The fine hole 20 is smaller than the through hole 12 and has a side surface covered by the metal pattern 19. In this case, the side surface of the through hole 12 need not necessarily be covered by the metal pattern 19. It is preferable that the size of the fine hole 20 be as small as possible, for the sake of securing a close contact area between the lower surface of the package 7 and the substrate 11. The diameter of the fine hole 20 is, for example, 0.4 mm.

The fine hole 20 diffuses heat transferred from the semiconductor chip 2 through the package 7 and the filler 14 to the back surface of the substrate 11, and thereby enhances an effect of heat dissipation.

Note that, in the present invention, each embodiment can be freely combined or each embodiment can be modified or omitted as appropriate within the scope of the invention.

While the disclosure has been shown and described in detail, the foregoing description is in all aspects illustrative and not restrictive. It is therefore understood that numerous modifications and variations can be devised.

What is claimed is:
1. A semiconductor device comprising:
  a semiconductor module including a semiconductor chip,
    a control integrated circuit (IC) configured to control driving of the semiconductor chip, and a package sealing the semiconductor chip and the control IC with an insulation material;

a substrate on which the semiconductor module is mounted; and a filler provided between a lower surface of the package of the semiconductor module and the substrate, wherein the substrate includes a through hole being provided at a position below the package and closer to the control IC than to the semiconductor chip in the package.

2. The semiconductor device according to claim 1, wherein the semiconductor module further includes a lead part having a first end connected to the semiconductor chip or the control IC inside the package and a second end exposed to outside from inside of the package, the substrate further includes a slit provided at a position inside the package with respect to a base end portion and below the package, and the base end portion is a portion at which the lead part is exposed from an outer surface of the package.

3. The semiconductor device according to claim 1, wherein the package includes a projecting portion or a recessed portion in a lower portion of the package.

4. The semiconductor device according to claim 1, wherein the through hole has a projecting shape in plan view.

5. The semiconductor device according to claim 1, wherein the substrate further includes a metal pattern covering a side surface of the through hole and extending from an edge of the through hole to a front surface and a back surface of the substrate.

6. The semiconductor device according to claim 5, wherein the substrate further includes a fine hole at a position below the package, and the fine hole is smaller than the through hole and has a side surface covered by the metal pattern.

7. The semiconductor device according to claim 1, wherein the filler fills a space between the lower surface of the package of the semiconductor module along substantially an entirety of the lower surface of the package of the semiconductor module.

8. The semiconductor device according to claim 1, wherein the semiconductor module is mounted to a conductive pattern on the substrate via conductive bonding material.

9. The semiconductor device according to claim 1, wherein the filler fills spaces between the lower surface of the package at positions respectively corresponding to the semiconductor chip and the control IC in a direction in which the mounted semiconductor module stacked on the substrate.

10. A method of manufacturing a semiconductor device, comprising the steps of:

preparing a semiconductor module including a semiconductor chip, a control integrated circuit (IC) configured to control driving of the semiconductor chip, and a package sealing the semiconductor chip and the control IC with an insulation material and a substrate including a through hole;

mounting the semiconductor module on the substrate such that the through hole is located at a position below the package and closer to the control IC than to the semiconductor chip in the package;

injecting a filler through the through hole to a space between a lower surface of the package of the semiconductor module and the substrate.

* * * * *